US011475190B1

(12) United States Patent
Han et al.

(10) Patent No.: US 11,475,190 B1
(45) Date of Patent: Oct. 18, 2022

(54) METHOD FOR DESIGNING AN INTEGRATED CIRCUIT AND AN INTEGRATED CIRCUIT DESIGNING SYSTEM PERFORMING THE SAME

(71) Applicant: Baum Design Systems Co., Ltd., Seoul (KR)

(72) Inventors: In Hak Han, Daejeon (KR); Joon Hwan Yi, Seoul (KR)

(73) Assignee: Baum Design Systems Co., Ltd., Seoul (KR)

( * ) Notice: Subject to any disclaimer, the term of this patent is extended or adjusted under 35 U.S.C. 154(b) by 0 days.

(21) Appl. No.: 17/750,410

(22) Filed: May 23, 2022

(30) Foreign Application Priority Data

May 25, 2021 (KR) .......................... 10-2021-0066858

(51) Int. Cl.
*G06F 30/327* (2020.01)
*G06F 30/3308* (2020.01)
(Continued)

(52) U.S. Cl.
CPC ........ *G06F 30/327* (2020.01); *G06F 30/3308* (2020.01); *G06F 30/337* (2020.01);
(Continued)

(58) Field of Classification Search
CPC ............... G06F 30/327; G06F 30/3308; G06F 30/3323; G06F 30/337; G06F 30/367; G06F 30/373; G06F 30/398
(Continued)

(56) References Cited

U.S. PATENT DOCUMENTS 5,841,674 A * 11/1998 Johannsen ............ G06F 7/5318
716/135
6,018,622 A * 1/2000 Lin ....................... G06F 30/327
716/135
(Continued)

FOREIGN PATENT DOCUMENTS

JP 2008-134824 A 6/2008
KR 10-11275150000 B1 3/2012
(Continued)

OTHER PUBLICATIONS

Plaza, "Synthesis and Verification of Digital Circuits using Functional Simulation and Boolean Satisfiability", University of Michigan, 2008, 191 pages. (Year: 2008).*

*Primary Examiner* — Phallaka Kik
(74) *Attorney, Agent, or Firm* — Nicholas Park

(57) ABSTRACT

Example embodiments relate to a method for designing integrated circuit based on a computer program including at least one instruction performed by an integrated circuit design system including a processor, the method comprising mapping, by the processor, at least one netlist signal to at least one RTL signal, determining, by the processor, a target netlist signal among the at least one netlist signal, determining, by the processor, a target expression of the target netlist signal using the netlist signal mapped to the at least one RTL signal based on at least a part of the netlist circuit, simulating, by the processor, on the at least one RTL signal, calculating, by the processor, signal simulation predicting information for the target netlist signal using the target expression and generating, by the processor, a design model by designing an integrated circuit using the signal simulation predicting information.

10 Claims, 12 Drawing Sheets

(51) Int. Cl.
*G06F 30/3323* (2020.01)
*G06F 30/337* (2020.01)
*G06F 30/373* (2020.01)
*G06F 30/398* (2020.01)
*G06F 30/367* (2020.01)

(52) U.S. Cl.
CPC ........ *G06F 30/3323* (2020.01); *G06F 30/367* (2020.01); *G06F 30/373* (2020.01); *G06F 30/398* (2020.01)

(58) Field of Classification Search
USPC ................... 716/104, 106, 111, 136; 703/16
See application file for complete search history.

(56) References Cited

U.S. PATENT DOCUMENTS

| | | | | |
|---|---|---|---|---|
| 6,131,080 | A * | 10/2000 | Raimi | G06F 30/33 716/108 |
| 6,243,850 | B1 * | 6/2001 | Shibuya | G06F 30/392 716/135 |
| 6,915,249 | B1 * | 7/2005 | Sato | G06F 30/367 379/22 |
| 7,735,036 | B2 * | 6/2010 | Dennison | G06F 30/30 716/106 |
| 8,214,787 | B1 * | 7/2012 | Reis | G06F 30/327 716/132 |
| 9,223,917 | B2 * | 12/2015 | Jabir | G06F 30/30 |
| 10,394,685 | B2 * | 8/2019 | O'Farrell | G06F 11/3684 |
| 10,482,206 | B1 * | 11/2019 | Guimarães et al. | G06F 11/004 |
| 11,074,231 | B1 * | 7/2021 | Emek | G06F 16/21 |
| 2002/0049576 | A1 * | 4/2002 | Meyer | G06F 30/367 703/4 |
| 2005/0010387 | A1 * | 1/2005 | Morishita | G06F 30/30 703/14 |
| 2008/0028114 | A1 * | 1/2008 | Mun | G06F 13/4282 710/105 |
| 2008/0072187 | A1 * | 3/2008 | Drasny | G06F 11/3664 716/102 |
| 2008/0127126 | A1 * | 5/2008 | Drasny | G06F 30/30 717/137 |
| 2009/0094569 | A1 * | 4/2009 | Kuchii | G06F 30/33 716/136 |
| 2009/0199136 | A1 * | 8/2009 | Reis | G06F 30/30 716/132 |
| 2010/0218147 | A1 * | 8/2010 | Ishikawa | G06F 30/3323 716/103 |
| 2011/0225038 | A1 * | 9/2011 | Fontoura | G06Q 30/02 707/711 |
| 2014/0032617 | A1 * | 1/2014 | Stanfill | G06F 16/25 707/809 |
| 2015/0199460 | A1 * | 7/2015 | Sundaresan | G06F 30/33 716/109 |
| 2018/0144002 | A1 * | 5/2018 | Girijavallabhan | G06F 16/2452 |
| 2019/0042207 | A1 * | 2/2019 | Shepil | G06F 8/42 |
| 2019/0384867 | A1 * | 12/2019 | Davidi | G06F 16/328 |
| 2021/0097222 | A1 * | 4/2021 | Liu | G03F 1/70 |

FOREIGN PATENT DOCUMENTS

| | | |
|---|---|---|
| KR | 10-12053250000 B1 | 11/2012 |
| KR | 10-2016-0012864 A | 2/2016 |
| KR | 10-2017-0036585 A | 4/2017 |

* cited by examiner

FIG. 7

| Gate | Power | Delay | OCGR | |
|------|-------|-------|------|---|
| INV  | P1    | D1    | O1   | ⌐DB_EI |
| XOR  | P2    | D2    | O2   | |
| OR   | P3    | D3    | O3   | |
| AND  | P4    | D4    | O4   | |

# METHOD FOR DESIGNING AN INTEGRATED CIRCUIT AND AN INTEGRATED CIRCUIT DESIGNING SYSTEM PERFORMING THE SAME

CROSS-REFERENCE TO RELATED APPLICATION

This application claims the benefit of priority from Korean Patent Application No. 10-2021-0066858, filed on May 25, 2021, in the Korean Intellectual Property Office, the disclosure of which is incorporated herein in its entirety by reference.

BACKGROUND

1. Technical Field

Present invention relates to a method for designing an integrated circuit.

2. Description of the Related Art

The design of a semiconductor integrated circuit is an operation of converting a behavior model of a chip that describes an operation to be obtained from a semiconductor system into a specific structural model that describes a connection between necessary components. The design process of such a semiconductor integrated circuit proceeds in stages, and only limited information could be obtained for each design stage. If the design evaluation is carried out based on the information obtained after the design stage and the design content does not satisfy the requirements, then the design should be restarted from the beginning which leads to loss of time and cost.

SUMMARY

The present disclosure relates to provide a method for designing an integrated circuit for obtaining circuit simulation predicting information for a netlist circuit before designing a netlist circuit by using a target expression and an integrated circuit design system for performing the same.

In an embodiment, the method for designing integrated circuit according to based on a computer program including at least one instruction performed by an integrated circuit design system including a processor, the method may comprise mapping, by the processor, at least one netlist signal to at least one RTL signal, determining, by the processor, a target netlist signal among the at least one netlist signal, determining, by the processor, a target expression of the target netlist signal using the netlist signal mapped to the at least one RTL signal based on at least a part of the netlist circuit, simulating, by the processor, on the at least one RTL signal, calculating, by the processor, signal simulation predicting information for the target netlist signal using the target expression and generating, by the processor, a design model by designing an integrated circuit using the signal simulation predicting information.

In an embodiment, the target netlist signal may be the netlist signal not mapped to the at least one RTL signal.

In an embodiment, the mapping, by the processor, at least one netlist signal to at least one RTL signal may comprise determining, by the processor, a first RTL signal and a first netlist signal each corresponding to the same first node on the RTL circuit and the netlist circuit and determining, by the processor, a second RTL signal and a second netlist signal each corresponding to the same second node on the RTL circuit and the netlist circuit.

In an embodiment, the determining, by the processor, a target expression of the target netlist signal using the netlist signal mapped to the at least one RTL signal based on at least a part of the netlist circuit may comprise determining, by the processor, a target node corresponding to the target netlist signal in the netlist circuit, tracing, by the processor, a first node and a second node from the target node in the netlist circuit and generating, by the processor, the target expression of the target netlist signal by using the first netlist signal of the first node and the second netlist signal of the second node based on the result of the tracing.

In an embodiment, the target expression may comprise at least one of an XOR operation, an AND operation, a NOT operation, and an OR operation for the first netlist signal and the second netlist signal.

In an embodiment, the simulating, by the processor, on the at least one RTL signal may comprise obtaining, by the processor, first simulation information for the first netlist signal and obtaining, by the processor, second simulation information for the second netlist signal.

In an embodiment, the calculating, by the processor, the signal simulation predicting information for the target netlist signal using the target expression may comprise obtaining, by the processor, expression predicting information corresponding to the target expression from a predicting information database and determining, by the processor, the signal simulation predicting information for the target netlist signal by using the expression predicting information, the first simulation information and the second simulation information.

In an embodiment, the method may further comprise determining, by the processor, the target netlist signal and the additional netlist signal as key signals for obtaining circuit simulation predicting information for the netlist circuit and obtaining, by the processor, the circuit simulation predicting information by applying the signal simulation predicting information and third simulation information corresponding to third netlist signal, to a predetermined predicting information expression.

In an embodiment, a method for designing an integrated circuit based on a computer program including at least one instruction performed by an integrated circuit design system including a processor, for a first design circuit and a second design circuit in the circuit design sequence, the method may comprise determining, by the processor, a plurality of nodes of the second design circuit corresponding to a plurality of nodes of the first design circuit as a plurality of mapping nodes, determining, by the processor, a target node among the plurality of nodes of the second design circuit, determining, by the processor, a target expression of the target node using the plurality of mapping nodes based on at least a part of the second design circuit, simulating, by the processor, the first design circuit, calculating, by the processor, signal simulation predicting information for the target node using the target expression and generating, by the processor, a design model by designing an integrated circuit using the signal simulation predicting information.

In an embodiment, a programmed computing system for executing a computer program providing a method for designing an integrated circuit, the programmed computing system may comprise an input/output device configured to receive the specifications of a design circuit and displays a design model corresponding to the designed circuit, a memory device configured to store the computer program and a processor configured to perform the method for designing the integrated circuit by accessing the memory device, wherein the processor, based on the computer program, configured to map at least one netlist signal to at least one RTL signal, determine a target netlist signal among the at least one netlist signal, determine a target expression of the target netlist signal using the netlist signal mapped to the at least one RTL signal based on at least a part of the netlist circuit, simulate on the at least one RTL signal, calculate signal simulation predicting information for the target netlist signal using the target expression and generate a design model by designing an integrated circuit using the signal simulation predicting information.

According to the technical idea of the present disclosure, the simulation result for the netlist circuit can be obtained as predicting information through simulation of RTL circuit by using the target expression and evaluation whether the requirements are satisfied can be performed based on the simulation result, the resource and time required for design can be minimized.

BRIEF DESCRIPTION OF THE DRAWINGS

FIG. 7 is a table showing a predicting information database according to an exemplary embodiment of the present disclosure.

Figure 1:
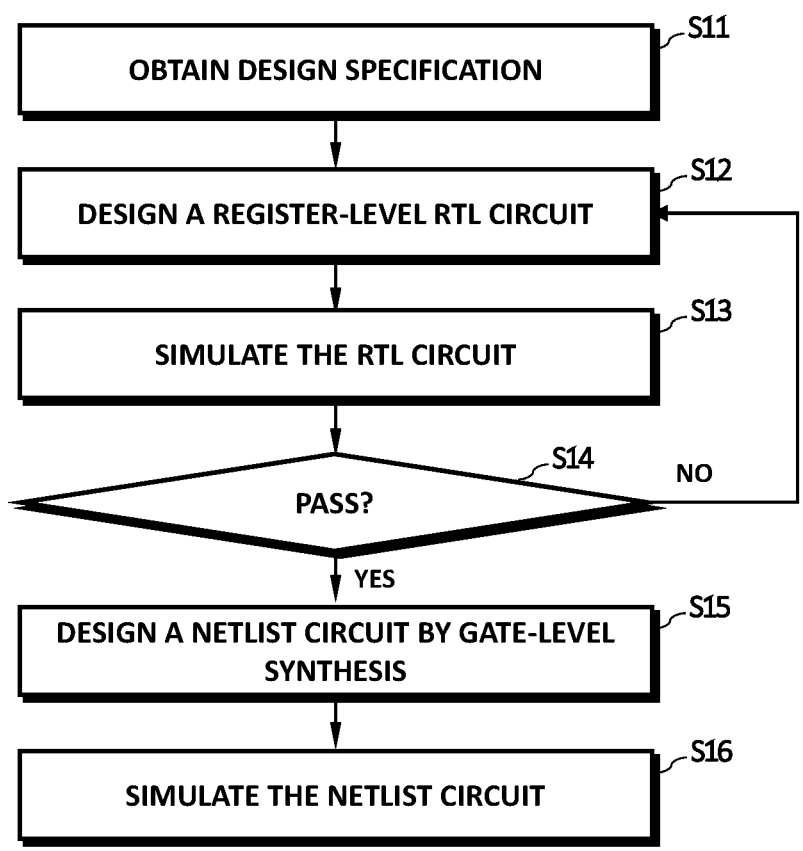
FIG. 1 is a flowchart illustrating a method for designing an integrated circuit.

The attached drawings are shown as references to understand the technical ideas of the present disclosure, and the scope of the present disclosure is not limited thereto.

DETAILED DESCRIPTION

Hereinafter, preferred embodiments of the present disclosure will be described in detail with reference to the accompanying drawings. Advantages and features of the present disclosure, and methods of achieving them will become apparent with reference to the embodiments described below in detail in conjunction with the accompanying drawings. However, the technical idea of the present disclosure is not limited to the following embodiments, but may be implemented in various different forms, and only the following embodiments complete the technical idea of the present disclosure, and in the technical field to which the present disclosure belongs It is provided to fully inform those of ordinary skill in the scope of the present disclosure, and the technical idea of the present disclosure is only defined by the scope of the claims.

In adding reference numerals to the components of each drawing, it should be noted that the same components are given the same reference numerals as much as possible even though they are indicated on different drawings. In addition, in describing the present disclosure, if it is determined that a detailed description of a related known configuration or function may obscure the gist of the present disclosure, the detailed description thereof will be omitted.

Unless otherwise defined, all terms (including technical and scientific terms) used herein may be used with the meaning commonly understood by those of ordinary skill in the art to which this disclosure belongs. In addition, terms defined in a commonly used dictionary are not to be interpreted ideally or excessively unless clearly specifically defined. The terminology used herein is for the purpose of describing the embodiments and is not intended to limit the present disclosure. In this specification, the singular also includes the plural unless otherwise specified in the phrase.

In addition, in describing the components of the present disclosure, terms such as first, second, A, B, (a), (b), etc. may be used. These terms are only for distinguishing the component from other components, and the essence, order, or order of the component is not limited by the term. When it is described that a component is "connected", "coupled" or "connected" to another component, the component may be directly connected or connected to the other component, but it should be also understood but another component may be "connected," "coupled," or "connected" between each component.

As used herein, "comprises" and/or "comprising" may not exclude one or more other components, steps, operations and/or elements besides referenced component, step, operation and/or element.

A component included in an embodiment and a component having a common function may be described using the same name in another embodiment. Unless otherwise stated, the descriptions in any an embodiment may be applied to other embodiments, and specific descriptions will be omitted within the overlapping range or within the range that can be clearly understood by those skilled in the art.

Hereinafter, the present disclosure will be described in detail with reference to preferred embodiments of the present disclosure and the accompanying drawings.

FIG. 1 is a flowchart illustrating a method for designing an integrated circuit according to a related art.

Referring to FIG. 1, in a design specification step S11, a specification of a design circuit is determined. In the register transfer level (RTL) circuit design step S12, a circuit function is designed using a hardware description language (HDL). The RTL simulation step S13 is a pre-layout simulation and performs RTL simulation to verify the function of the RTL circuit design S12.

As a result of the RTL simulation, it is determined whether the RTL circuit design is correctly designed S14, and if the function of the RTL circuit design S12 is correctly designed, the netlist circuit design is performed by synthesizing the gate level S15, otherwise It returns to the RTL circuit design step S12. In the RTL circuit design S12, the functional error of the register-level design is corrected, and the RTL simulation step S13 is performed again. The process of fixing errors or bugs is called debugging.

In the netlist circuit design S15, the register-level design S12 is converted into a gate-level netlist design. When the conversion is completed, a netlist simulation S16 is performed. In one example, in the netlist simulation S16, the timing of the gate-level netlist may be verified using a Standard Delay Format (SDF) file. It is determined whether the result of the netlist simulation S16 conforms to the design specification, and if the result of the netlist simulation S16 is suitable for the design specification, it proceeds to the layout wiring design stage.

Although not shown thereafter, in the layout stage, logic gates of gate level design are wired and arranged. When the layout wiring design is completed, the post-layout simulation phase begins. In the simulation stage after layout wiring, the design model is finally created by verifying the timing of the gate level design using the delay information for each gate and all nets by the layout wiring design.

According to the circuit design of the related art described above in FIG. 1, when determining whether the design specification is suitable after the RTL simulation S13 step, information on the netlist circuit cannot be reflected on RTL circuit, and the netlist simulation S16 result is evaluated as inappropriate, the problem of having to redesign the RTL circuit may arise.

Figure 2:
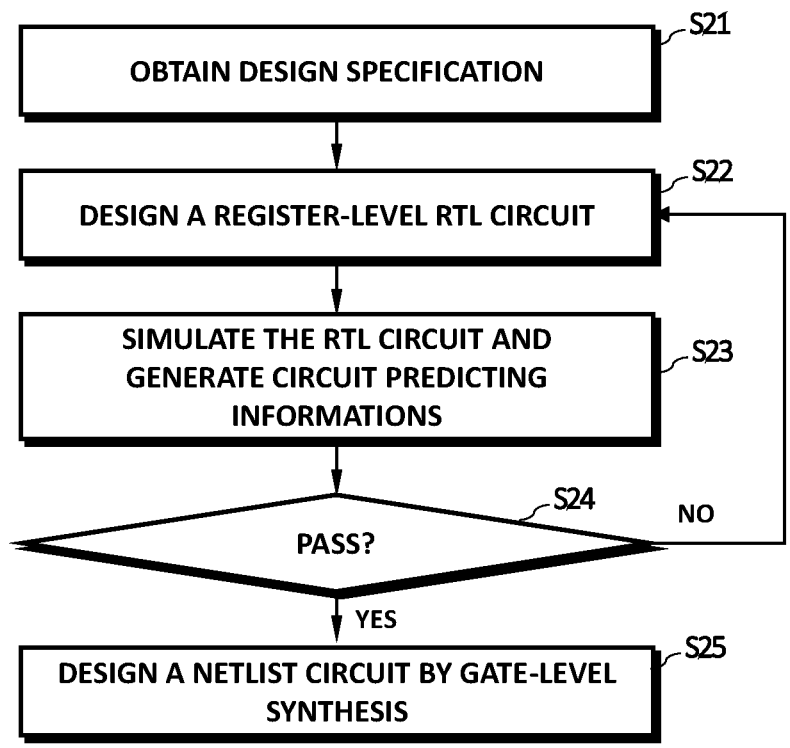
FIG. 2 is a block diagram illustrating a method for designing an integrated circuit according to an exemplary embodiment of the present disclosure.

FIG. 2 is a block diagram illustrating a method for designing an integrated circuit according to an exemplary embodiment of the present disclosure. Content overlapping with FIG. 1 will be omitted.

Referring to FIG. 2, in the design specification step S21, the specification of the design circuit is determined. In the RTL circuit design step S22, a register-level RTL circuit is designed. In the RTL simulation step S23, circuit simulation predicting information may be generated and simulations may be performed on the RTL circuit. In the present specification, the simulation predicting information may refer to predicting information for a simulation result that can be obtained based on a simulation result for another signal using a target expression without a simulation for a circuit or a signal.

In the verification step S24 after the RTL simulation, it is determined whether the RTL circuit design S22 is correctly designed based on the circuit simulation predicting information for the netlist circuit as well as the RTL simulation result, and if the function of the RTL circuit design S22 is correct, the netlist circuit design S25 is performed by synthesis for the gate level. Otherwise, the RTL circuit design step S22 may be performed again. Although not shown, after the netlist circuit design S25, as described above in FIG. 1, a design model is finally generated through steps such as a netlist simulation and a simulation after placement and wiring.

According to the technical idea of the present disclosure, circuit simulation predicting information, that can be obtained by simulation of a netlist circuit in the related art, can be obtained at the RTL design level, and the design of the RTL circuit can be verified based on the circuit simulation predicting information. A netlist circuit can contain much more components than an RTL circuit. Accordingly, the time required for the simulation of the netlist circuit may be much longer than the time required for the simulation of the RTL circuit. According to the technical idea of the present disclosure, information, that can be obtained after simulation of the netlist circuit according to the related art, can be obtained only by simulation of the RTL circuit without performing a simulation on the netlist circuit based on the circuit simulation predicting information, and accordingly, it is possible to obtain simulation results in much less time. In addition, information that can be confirmed only after designing the netlist circuit can be confirmed in advance through the netlist circuit simulation predicting information, and by verifying the RTL circuit based on the netlist circuit simulation predicting information, failure to design specifications that may occur when designing the netlist circuit is reduced. Efficient circuit design can be performed as it is confirmed only by simulating RTL circuit.

Figure 3:
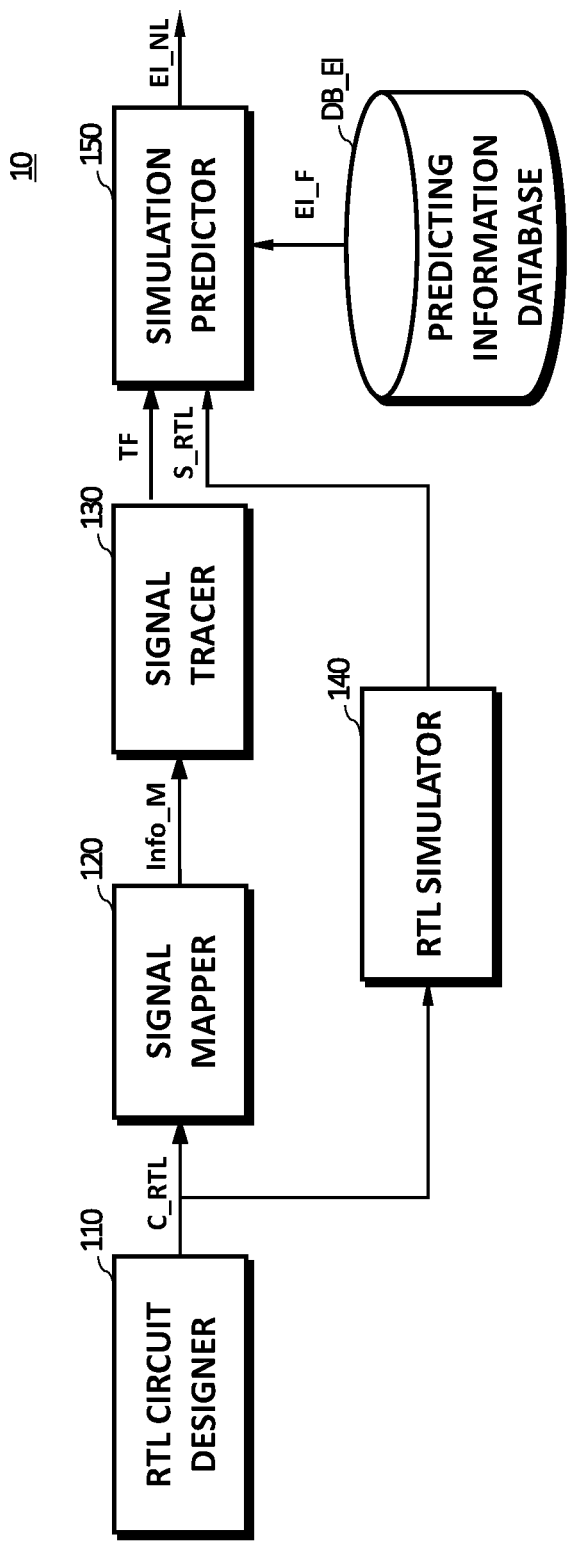
FIG. 3 is a block diagram illustrating an integrated circuit design system according to an exemplary embodiment of the present disclosure.

FIG. 3 is a block diagram illustrating an integrated circuit design system according to an exemplary embodiment of the present disclosure.

Referring to FIG. 3, the integrated circuit design system 10 may be used to design an integrated circuit (IC). The integrated circuit design system 10 is a cellular phone, a smart phone, a laptop, a Personal Computer, navigation, Personal Communication System, Global System for Mobile communications, Personal Digital Cellular, Personal Handyphone System, Personal Digital Assistant, International Mobile Telecommunication(IMT)-2000, Code Division Multiple Access(CDMA)-2000, W-CDMA, a wireless broadband Internet terminal, a smart pad, a tablet PC, etc. may be implemented by various communication terminal devices.

The integrated circuit design system 10 may include an RTL circuit designer 110, a signal mapper 120, a signal tracer 130, an RTL simulator 140, and a simulation predictor 150. In the present specification, the operation of the integrated circuit design system 10 or components included therein, may refer to an operation performed by a processor included in the integrated circuit design system 10, based on a computer program including at least one instruction stored in a storage device included in the integrated circuit design system 10. In addition, the processor may include at least one of a central processing unit (CPU), a graphic processing unit (GPU), a neural processing unit (NPU), a Random Access Memory(RAM), a Read Only Memory(ROM), a system bus, and an application processor.

The RTL circuit designer 110 may design an RTL circuit C_RTL that meets design specifications and transmit the designed RTL circuit C_RTL to the signal mapper 120 and the RTL simulator 140. The RTL circuit C_RTL may be configured as a register-level circuit as described above.

The signal mapper 120 may map a signal between a register-level RTL circuit C_RTL and a gate-level netlist circuit. In the present specification, a signal for a circuit may mean a signal having various information (eg, voltage, current, power consumption, delay, Operational Clock Gating Ratio (OCGR), etc.) for each node constituting the circuit.

In one example, the register-level RTL circuit C_RTL may include a plurality of RTL nodes, and the gate-level netlist circuit may include a plurality of netlist nodes including the plurality of RTL nodes. The signal mapper 120 may map a signal between the RTL circuit C_RTL and the netlist circuit by mapping netlist nodes corresponding to RTL nodes among the plurality of netlist nodes to RTL nodes. In this specification, the RTL node may mean a node included in the RTL circuit C_RTL, and the RTL signal may mean a signal that can be confirmed by the RTL node. In addition, the netlist node may mean a node included in the netlist circuit, and the netlist signal may mean a signal that can be confirmed in the netlist node.

The signal mapper 120 can generate mapping information Info_M through the mapping of signals between the RTL circuit C_RTL and the netlist circuit, and the signal tracer 130 can trace back the target netlist signal to the target expression TF can be determined. In the present specification, backtracking may refer to an operation of tracing a signal while passing through a device included in a circuit in a direction opposite to a signal flow (eg, from an output to an input direction of the device). In addition, the target netlist signal may mean a signal necessary to confirm information about the netlist circuit (eg, circuit simulation predicting information). Also, the target expression TF may mean an expression expressing the target netlist signal using the netlist signal mapped with the RTL signal.

The RTL simulator 140 may generate an RTL simulation result S_RTL through simulation of the RTL circuit C_RTL. The simulation result S_RTL may include various types of information about the RTL signal (eg, voltage, current, power consumption, delay, and Operational Clock Gating Ratio (OCGR)).

The simulation predictor 150 may generate netlist circuit simulation predicting information EI_NL based on the predicting information database DB_EI, the target expression TF, and the simulation result S_RTL. The predicting information database DB_EI may include various predicting information (eg, voltage, current, power consumption, delay, OCGR) for the elements determined in advance, and the simulation predictor 150 may acquire predicting information for the elements included in the target expression TF from predicting information database and generate the signal simulation predicting information for the target netlist signal based on the obtained predicting information and the simulation result S_RTL for the RTL signal corresponding to the netlist signal included in the target expression TF. The simulation predictor 150 may generate circuit simulation predicting information EI_NL for the netlist circuit based on the signal simulation predicting information.

According to the technical idea of the present disclosure, the integrated circuit design system 10 can obtain predicting information for the netlist circuit by using the target expression before designing the netlist circuit, and acquire predicting information about the netlist circuit using the simulation results for the RTL circuit instead of the simulation for the netlist circuit that takes a long time, the time required for simulation can be shortened.

Figure 4:
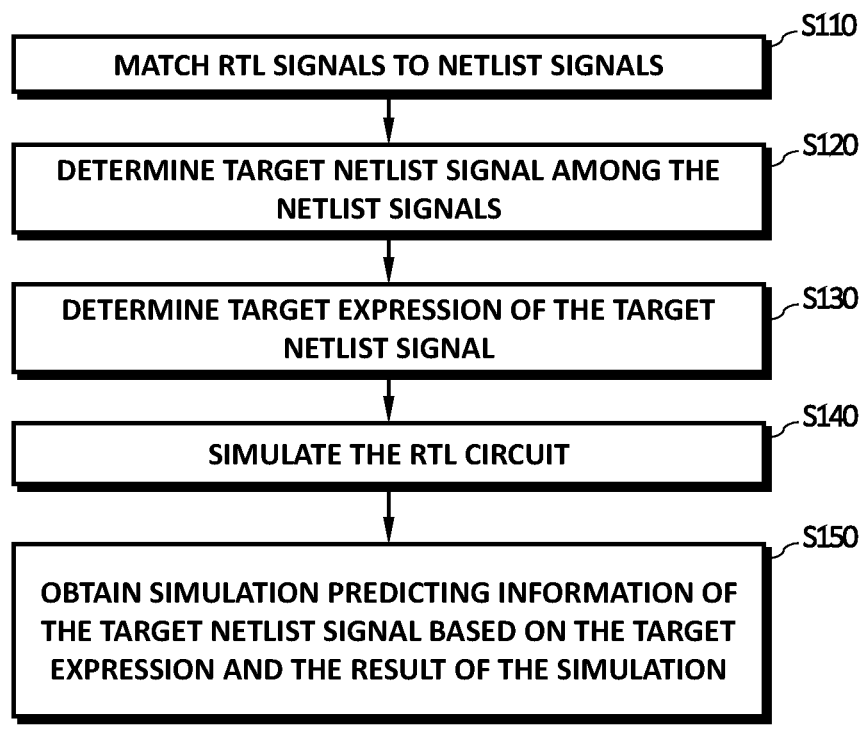
FIG. 4 is a flowchart illustrating a method for designing an integrated circuit according to an exemplary embodiment of the present disclosure.

FIG. 4 is a flowchart illustrating a method for designing an integrated circuit according to an exemplary embodiment of the present disclosure.

Referring to FIGS. 3 and 4, the integrated circuit design system 10 may match signals of the netlist circuit and the RTL circuit S110. In an embodiment, since the netlist circuit is a circuit more detailed at the gate level compared to the circuit of the RTL, the nodes included in the netlist circuit may be included in the RTL circuit, and by determining the nodes corresponding to each other, the integrated circuit design system 10 may match the signal between the two circuits.

The integrated circuit design system 10 may determine a target netlist signal from among the netlist signals S120. In an embodiment, the target netlist signal may be one of the netlist signals that do not match the RTL signal and may be predetermined to obtain the netlist circuit simulation predicting information.

The integrated circuit design system 10 may determine a target expression for the target netlist signal 5130. In an embodiment, the integrated circuit design system 10 may generate the target expression by tracing back from the node corresponding to the target netlist signal to the node corresponding to the netlist signal matching the RTL signal based on the netlist circuit. The target expression may be determined based on a gate element existing in the traceback route, and in one example, the gate element may include any one element of AND, OR, XOR, and NOT operator.

The integrated circuit design system 10 may perform a simulation on the RTL circuit S140. The integrated circuit design system 10 may obtain a simulation result of RTL signal and a netlist signal corresponding to the RTL signal.

The integrated circuit design system 10 may acquire signal simulation predicting information for the target netlist signal based on the simulation result and the target expression S150. In an embodiment, the integrated circuit design system 10 generates signal simulation predicting information based on the simulation result for RTL signal corresponding to the netlist signals included in the target expression and predicting information for the element included in the target expression.

Figure 5:
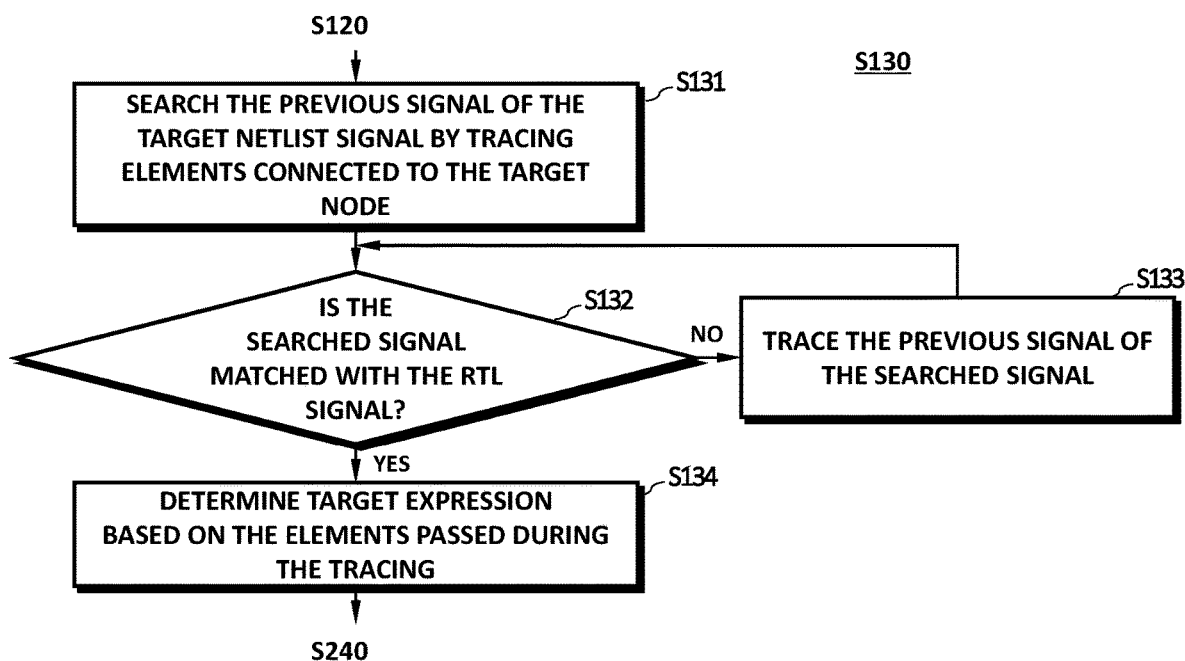
FIG. 5 is a flowchart illustrating a method for designing an integrated circuit according to an exemplary embodiment of the present disclosure.

FIG. 5 is a flowchart illustrating a method for designing an integrated circuit according to an exemplary embodiment of the present disclosure. In detail, FIG. 5 is a figure showing in detail the target expression determination step S130 shown in FIG. 4.

Referring to FIGS. 3 and 5, the integrated circuit design system 10 may search a signal for a previous node by tracing back the elements connected to the target netlist signal S131. The integrated circuit design system 10 may determine whether the signal searched on S131 is the signal matched with the RTL signal S132.

When the search signal is not a signal matched with the RTL signal, the integrated circuit design system 10 may perform back-tracing once more to search for a previous signal S133. When the search signal is a signal matched with the RTL signal, the integrated circuit design system 10 may determine the target expression based on the elements passed during the back-tracing S134.

Figure 6:
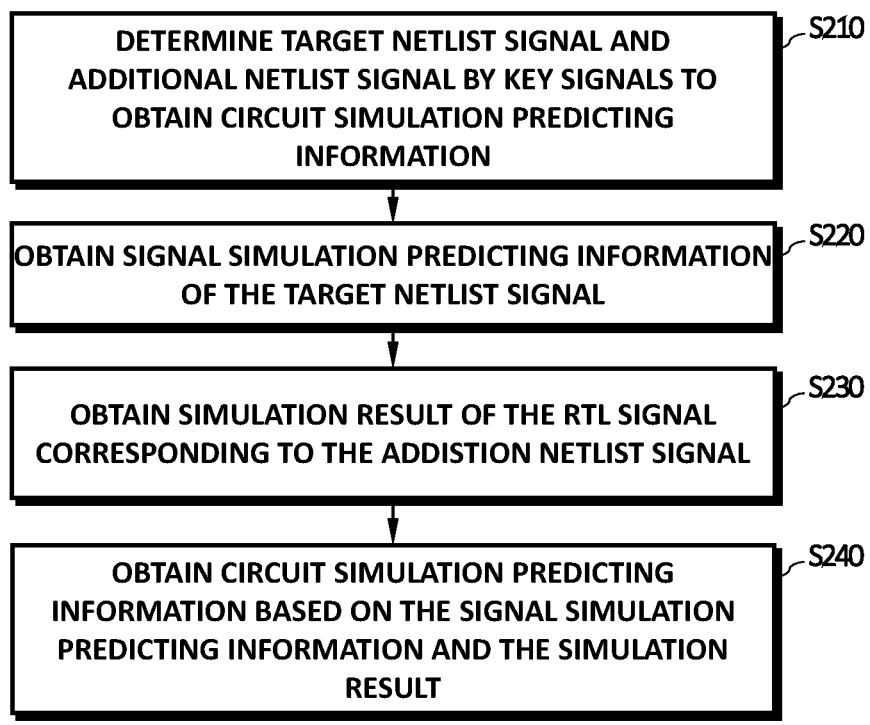
FIG. 6 is a flowchart illustrating a method for designing an integrated circuit according to an exemplary embodiment of the present disclosure.

FIG. 6 is a flowchart illustrating a method for designing an integrated circuit according to an exemplary embodiment of the present disclosure. In detail, FIG. 6 shows a method of obtaining circuit simulation predicting information.

Referring to FIGS. 3 and 6, the integrated circuit design system 10 may determine a target netlist signal and an additional netlist signal as a key signal for acquiring circuit simulation predicting information S210. In the present specification, the additional netlist signal may mean a signal required to acquire circuit simulation predicting information among netlist signals that can be matched with RTL signal. FIG. 6 shows an embodiment in which a target netlist signal and an additional netlist signal are included in the key signal, but only the target netlist signal is included in the key signal, or one or more target netlist signals and one or more additional netlist signals are included in the key signal according to an embodiment of the present disclosure.

In an embodiment, the integrated circuit design system 10 may determine a key signal based on a predetermined equation for obtaining circuit simulation predicting information for the entire circuit.

The integrated circuit design system 10 may acquire signal simulation predicting information for the target netlist signal S220. A detailed description of the signal simulation predicting information acquisition method will be omitted as described above with reference to FIGS. 2 to 5.

The integrated circuit design system 10 may obtain a simulation result for the RTL signal corresponding to the additional netlist signal S230. In an embodiment, the integrated circuit design system 10 may obtain a simulation result for the additional netlist signal by simulating the RTL circuit.

The integrated circuit design system 10 may acquire circuit simulation predicting information based on the signal simulation predicting information for the target netlist signal and the simulation result for the additional netlist signal S240. In an embodiment, the integrated circuit design system 10 may obtain the circuit simulation predicting information by substituting the signal simulation predicting information and the simulation result into a predetermined equation.

According to an embodiment of the present disclosure, the integrated circuit design system 10 may obtain a signal simulation predicting information for a netlist signal without simulation of the netlist circuit and obtain a circuit simulation predicting information for the entire circuit using the signal simulation prediction result. By doing so, various information about the circuit (eg, voltage, current, power consumption, OCGR, delay) can be efficiently acquired.

FIG. 7 is a table showing a predicting information database according to an exemplary embodiment of the present disclosure. In detail, FIG. 7 shows the predicting information database DB_EI of FIG. 2.

Referring to FIGS. 3 and 7, the predicting information database DB_EI may include predicting information for each element or gate. In one example, the predicting information database DB_EI may be provided as a standard cell library. In the example of FIG. 7, the predicting information database DB_EI may include power consumption Power, delay time Delay, and OCGR for each element. The inverter gate INV corresponding to the inverter operator has a first power consumption P1, a first delay D1, and a first OCGR O1, and the XOR (exclusive or) gate XOR corresponding to the XOR operator has a second power consumption P2 and a second delay D2. and a second OCGR O2, the OR gate OR corresponding to the OR operator has a third power consumption P3, a third delay D3, and a third OCGR O3, and the AND gate AND corresponding to the AND operator has a fourth power consumption P4, the fourth delay D4, and the fourth OCGR O4 may have as predicting information.

The integrated circuit design system 10 may generate signal simulation predicting information with reference to the predicting information database DB_EI. In one example, the integrated circuit design system 10 may generate signal simulation predicting information by checking the predicting information for the operator included in the target expression in the predicting information database DB_EI and combining the confirmed predicting information and the simulation result.

Figure 8A:
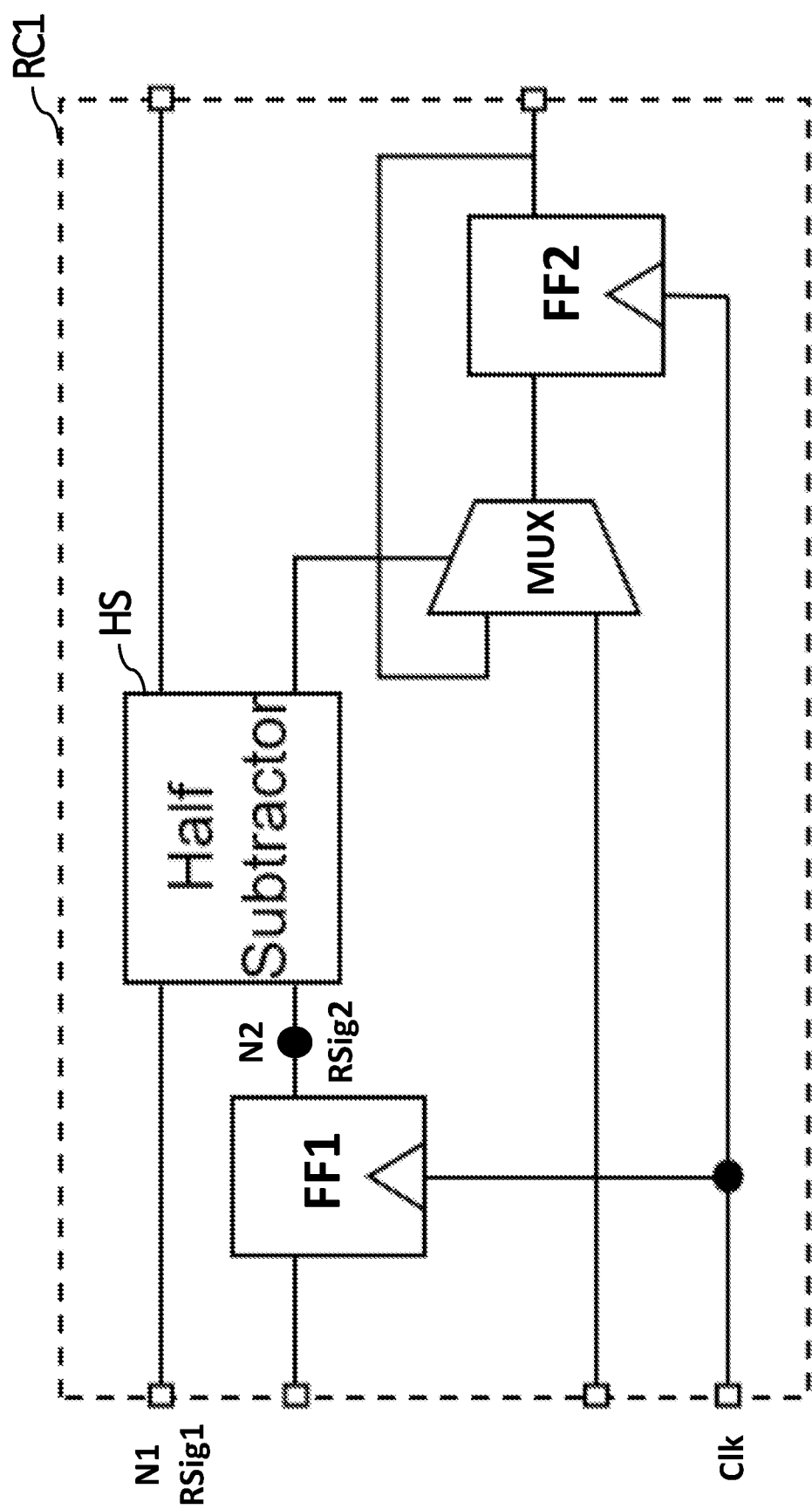
FIG. 8A shows an RTL circuit according to an exemplary embodiment of the present disclosure.
Figure 8B:
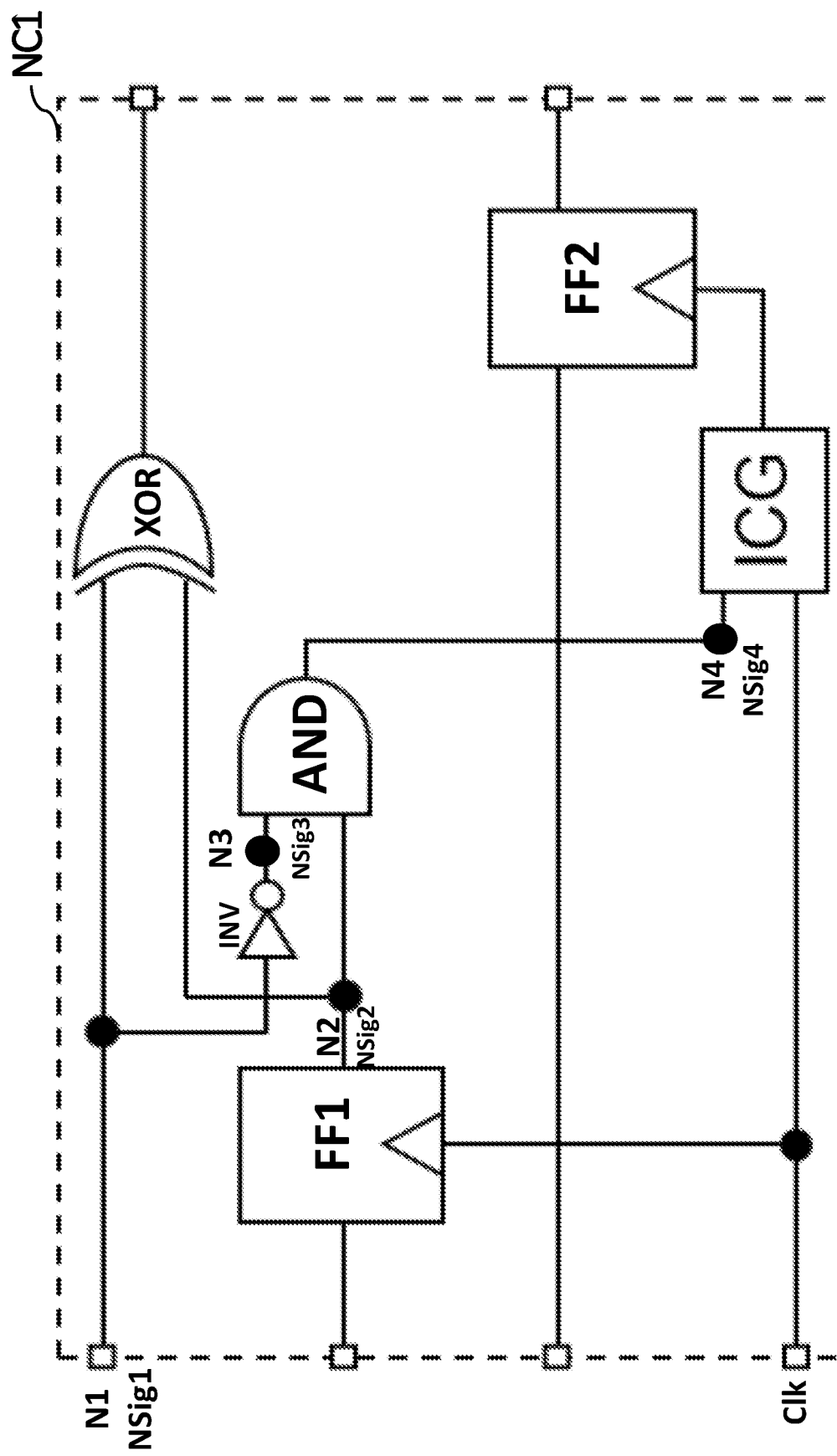
FIG. 8B shows a netlist circuit according to an exemplary embodiment of the present disclosure.

FIG. 8A shows an RTL circuit according to an exemplary embodiment of the present disclosure, and FIG. 8B shows a netlist circuit according to an exemplary embodiment of the present disclosure.

According to FIGS. 3, 8A, and 8B, the first RTL circuit RC1 may represent a circuit designed at the register level, and the first netlist circuit NC1 may represent the circuit designed with the first RTL circuit at the gate level. The first RTL circuit RC1 may include a half-subtractor HS, a first flip-flop FF1, a multiplexer MUX, and a second flip-flop FF2. As shown in FIG. 8A, in the first RTL circuit RC1, a first RTL signal RSig1 corresponding to the first node N1 and a second RTL signal RSig2 corresponding to the second node N2 may be applied.

The first netlist circuit NC1 may be a circuit designed by specifying the first RTL circuit RC1 at the gate level, and include a first flip-flop FF1, an inverter gate INV, an AND gate AND, and an XOR gate XOR, an integrated clock gating cell ICG. As shown in FIG. 8B, in the first netlist circuit NC1, a first netlist signal NSig1 corresponding to the first node N1, a second netlist signal NSig2 corresponding to the second node N2, a third netlist signal NSig3 corresponding to the third node N3, and a fourth netlist signal NSig4 corresponding to the fourth node N4 may be applied.

Hereinafter, an operation of the integrated circuit design system 10 in the examples of FIGS. 8A and 8B will be described.

The integrated circuit design system 10 may map signals included in the first RTL circuit RC1 and the first netlist circuit NC1. In the example of FIGS. 8A and 8B, the first node N1, the second node N2 and the clock pin are the same, so the first RTL signal RSig1—the first netlist signal NSig1, the second RTL signal RSig2—second netlist signal NSig2 and clock signal Clk may be mapped.

The integrated circuit design system 10 may determine a target netlist signal for the first netlist circuit NC1 among unmapped signals. In the example of FIGS. 8A and 8B, in order to obtain the OCGR for the first netlist circuit NC1, a gating ratio may be obtained based on the clock input to the first flip-flop FF1 and the second flip-flop FF2. Since the first flip-flop FF1 directly receives the clock signal Clk as a clock input, only gating of the clock input of the second flip-flop FF2 may be required. Since the output of the integrated clock gating cell ICG is used for the clock input of the second flip-flop FF2, the integrated circuit design system 10 may determine a fourth netlist signal NSig4, which is an input to the integrated clock gating cell ICG among signals except for the mapped clock signal Clk, may be determined as a target netlist signal.

The integrated circuit design system 10 may determine the target expression by performing a trace-back from the fourth netlist signal NSig4. In the example of FIG. 8B, the fourth node N4 is an output of an AND gate AND, and the AND gate AND has a second node N2 and a third node N3 as inputs. Among them, the second netlist signal NSig2 of the second node N2 is a mapped signal, but the third netlist signal NSig3 of the third node N3 is not a mapped signal. Since the third node N3 is the output of the inverter gate INV, the first netlist signal NSig1 of the first node N1 may be searched when backtracking is performed as the input of the inverter gate INV. Since the first netlist signal NSig1 is a mapped signal, the integrated circuit design system 10 may use the first netlist signal NSig1, the inverter gate INV, the second netlist signal NSig2, and the AND gate AND to determine the target expression. The target expression can be determined as in Equation 1 below.

$$NSig4 = NSig1' \& NSig2 \qquad \text{[Equation 1]}$$

Equation 1 may mean that the fourth netlist signal NSig4 can be obtained by inverting the first netlist signal NSig1 (NSig1') and performing AND operator (&) with the second netlist signal NSig2.

The integrated circuit design system 10 may calculate the OCGR by using Equation 1. In one example, the integrated circuit design system 10 may determine the logic values for each timing of the first netlist signal NSig1 and the second netlist signal NSig2 and use Equation 1 to calculate the signal simulation predicting information of the fourth netlist signal NSig4 as '1' or '0'. The integrated circuit design system 10 may use the signal simulation predicting information to operate the second flip-flop FF2. When the fourth netlist signal NSig4 is '1', the integrated circuit design system may calculate '0%' as OCGR, which is the circuit simulation predicting information, since the second flip-flop FF2 is gated and when the fourth netlist signal NSig4 is '0', the integrated circuit design system may calculate '50%' as OCGR, since the second flip-flop FF2 does not operate and only the first flip-flop FF1 operates.

According to an embodiment of the present disclosure, the integrated circuit design system 10 may determine a target expression and uses it to obtain OCGR, which is circuit simulation predicting information, thereby the information only available in the netlist circuit stage can be obtained by simulating an RTL circuit without a simulation of a netlist circuit with a relatively large number of elements.

Figure 9A:
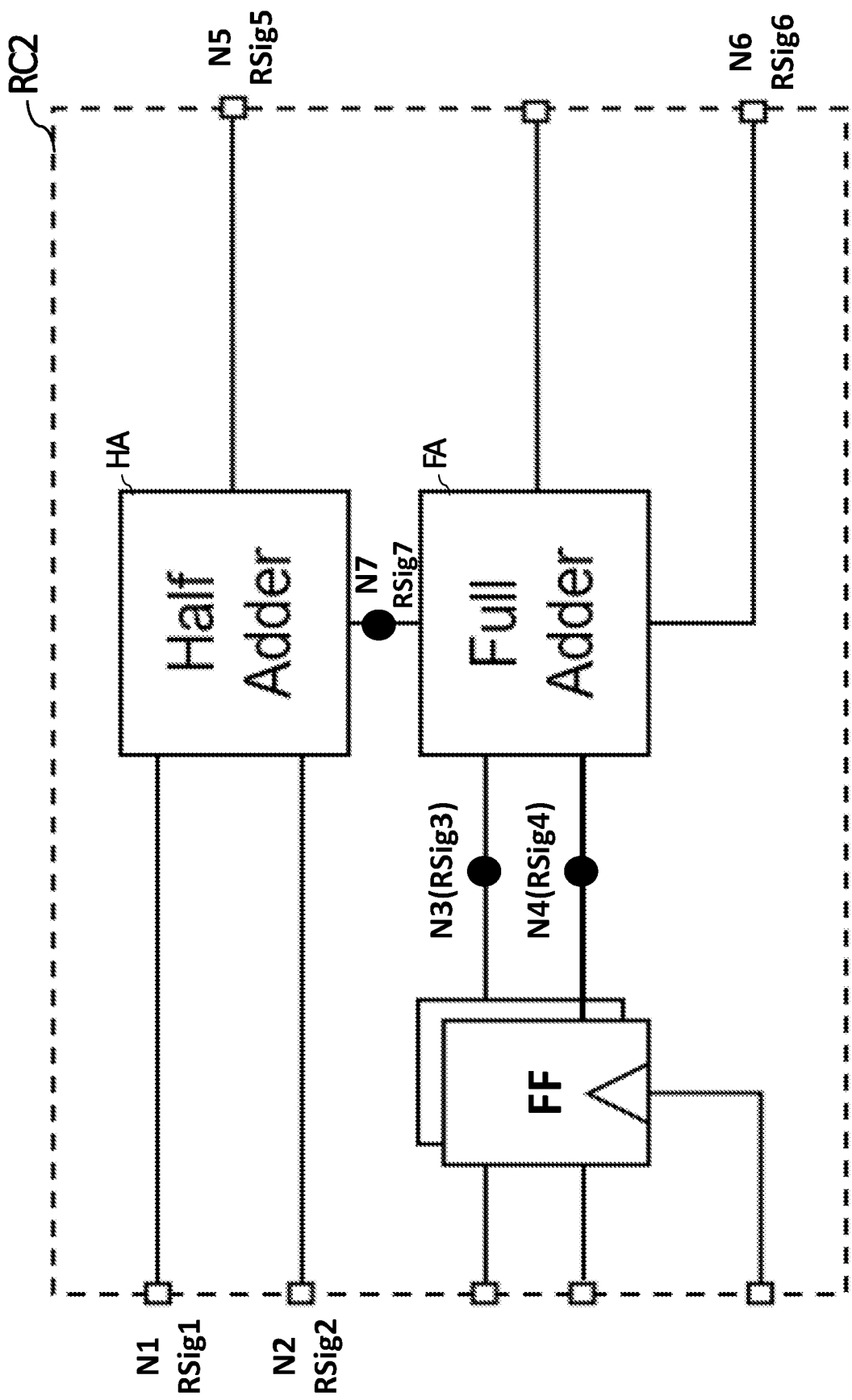
FIG. 9A shows an RTL circuit according to an exemplary embodiment of the present disclosure.
Figure 9B:
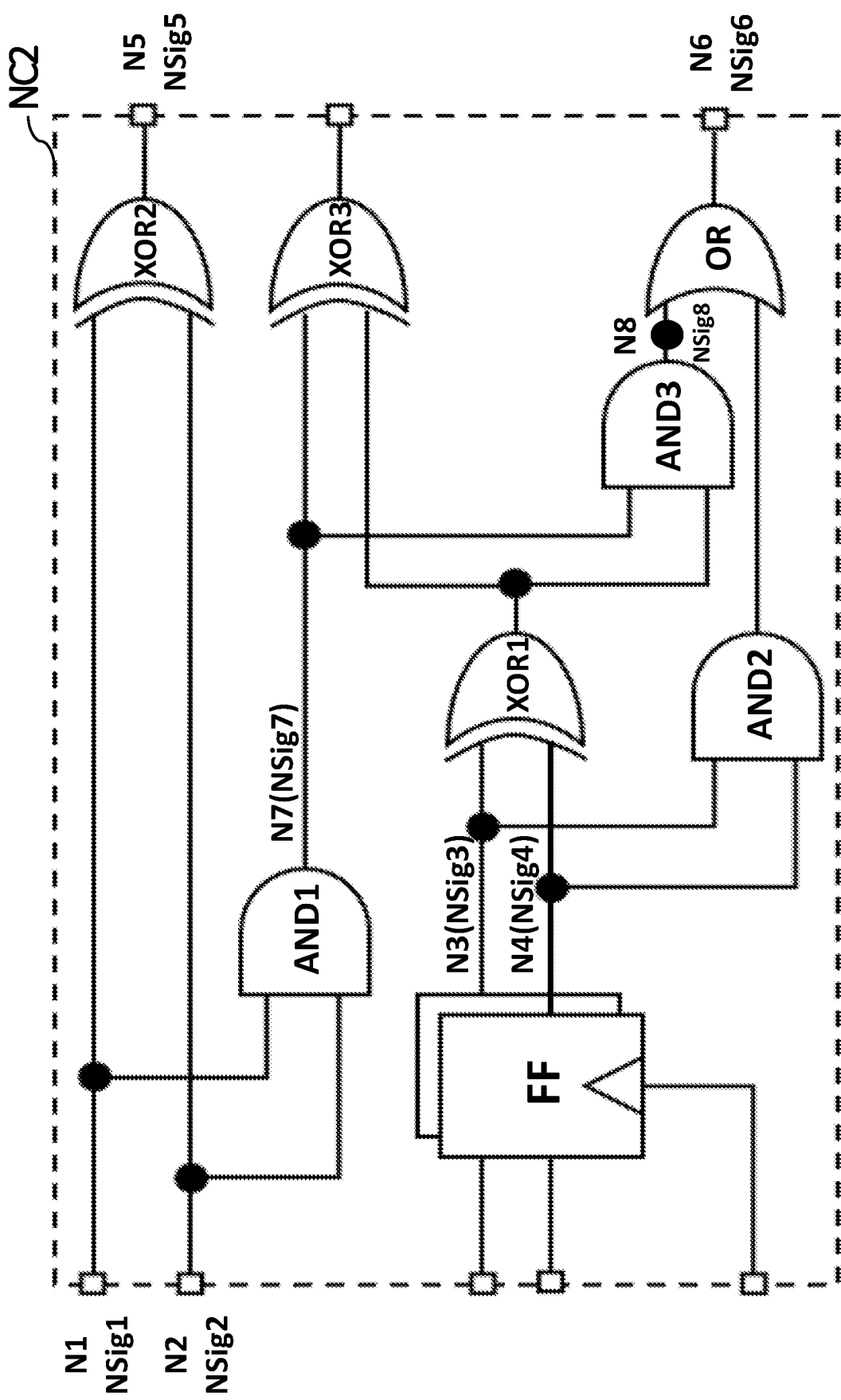
FIG. 9B shows a netlist circuit according to an exemplary embodiment of the present disclosure.

FIG. 9A shows an RTL circuit according to an exemplary embodiment of the present disclosure, and FIG. 9B shows a netlist circuit according to an exemplary embodiment of the present disclosure.

Referring to FIGS. 3, 9A, and 9B, the second RTL circuit RC2 may represent a circuit designed at the register level, and the second netlist circuit NC2 may represent a circuit designed the second RTL circuit RC2 at the gate level. The second RTL circuit RC2 may include a half adder HA, a full adder FA, and a flip-flop FF. In addition, as shown in FIG. 9A, a first RTL signal RSig1 corresponding to the first node N1, and a second RTL signal RSig2 corresponding to the second node N2, the third RTL signal RSig3 corresponding to the third node N3, the fourth RTL signal RSig4 corresponding to the fourth node N4, and the fifth RTL signal RSig5, a sixth RTL signal RSig6 corresponding to the sixth node N6, and a seventh RTL signal RSig7 corresponding to the seventh node N7 may be applied in the second RTL circuit RC2.

The second netlist circuit NC2 may be a circuit designed by specifying the second RTL circuit RC2 at the gate level, and include a flip-flop FF1, a first AND gate AND1, a second AND gate AND2, a third AND gate AND3, a first XOR gate XOR1, a second XOR gate XOR2, a third XOR gate XOR3, and an OR gate OR. In addition, as shown in FIG. 9B, a first netlist signal NSig1 corresponding to the first node N1, a second netlist signal NSig2 corresponding to the second node N2, a third netlist signal NSig3 corresponding to the third node N3, a fourth netlist signal NSig4 corresponding to the fourth node N4, a fifth netlist signal NSig5 corresponding to the fifth node N5, a sixth netlist signal NSig6 corresponding to the sixth node N6, a seventh netlist signal NSig7 corresponding to the seventh node N7, and an eighth netlist signal NSig8 corresponding to the eighth node N8 may be applied in the second netlist circuit NC2.

Hereinafter, the operation of the integrated circuit design system 10 in the examples of FIGS. 9A and 9B will be described.

The integrated circuit design system 10 may map signals included in the second RTL circuit RC2 and the second netlist circuit NC2. In the example of FIGS. 9A and 9B, since the first node N1 to the seventh node N7 are the same, the first RTL signal RSig1—the first netlist signal NSig1, the second RTL signal RSig2—the second netlist signal NSig2, the third RTL signal RSig3—the third netlist signal NSig3, the fourth RTL signal RSig4—the fourth netlist signal NSig4, the fifth RTL signal RSig5—the fifth netlist signal NSig5, the sixth RTL signal RSig6—the sixth netlist signal NSig6 may be mapped.

The integrated circuit design system 10 may determine a target netlist signal for the second netlist circuit NC2 among unmapped signals. In the examples of FIGS. 9A and 9B, the total power consumption P may be experimentally determined by Equation 2 below.

$$P = 5 + 10 \cdot NSig5 + 7 \cdot NSig8 \qquad \text{[Equation 2]}$$

Accordingly, in order to obtain the total power consumption, the fifth netlist signal NSig5 and the eighth netlist signal NSig8 may be determined as key signals, and among them, the fifth netlist signal NSig5 mapped to the second RTL circuit RC2 is determined as an additional netlist signal, and an eighth netlist signal NSig8 that is not mapped with the second RTL circuit RC2 may be determined as a target netlist signal.

The integrated circuit design system 10 may determine the target expression by performing a trace back from the fifth netlist signal NSig5. In the example of FIG. 9B, the eighth node N8 is the output of the third AND gate AND3, and the third AND gate AND3 receives the output of the first XOR gate XOR1 and the seventh netlist signal NSig7. Among them, the seventh netlist signal NSig7 of the seventh node N7 is a mapped signal, but since the output of the first XOR gate XOR1 is not a mapped signal, back-tracing may be performed once more. The input of the first XOR gate XOR1 is the third netlist signal NSig3 and the fourth netlist signal NSig4 of the third node N3, and since the third netlist signal NSig3 and the fourth netlist signal NSig4 are mapped signals a third netlist signal NSig3, a fourth netlist signal NSig4, a first XOR gate XOR1, a seventh netlist signal NSig7, and a third AND gate AND3 may be used to determine the target expression. The target expression can be determined as in Equation 3 below.

$$NSig8 = (NSig3 \char`\^ NSig4) \& NSig7 \qquad \text{[Equation 3]}$$

Equation 3 may describe the eighth netlist signal NSig8 may be obtained by performing the XOR operator(^) for the third netlist signal NSig3 and the fourth netlist signal NSig4 and AND operator(&) for the seventh netlist signal NSig7.

The integrated circuit design system 10 may calculate power consumption by using Equation 3. In one example, the integrated circuit design system 10 may simulate the power consumption for the third netlist signal NSig3, the fourth netlist signal NSig4, and the seventh netlist signal NSig7 for the second RTL circuit RC2. The power consumption for the XOR gate and the AND gate may be obtained based on the predicting information database DB_EI. The power consumption for the eighth netlist signal NSig8 may be obtained by using the obtained power consumption of the third netlist signal NSig3, the fourth netlist signal NSig4, the seventh netlist signal NSig7, the XOR gate and the AND gate as the signal simulation prediction information based on Equation 3 which is the target expression.

In addition, the integrated circuit design system 10 may predict the circuit simulation by substituting the power consumption of the fifth netlist signal NSig5 obtained as a result of the RTL simulation and the signal simulation predicting information for the eighth netlist signal NSig8 into Equation 2. In result, the power consumption for the entire circuit can be obtained by Equation 2. In this specification, a formula (eg, Equation 2) for obtaining circuit simulation predicting information (eg, power consumption) may be referred to as a predicting information expression.

According to an embodiment of the present disclosure, the integrated circuit design system 10 may determine a target expression to obtain power consumption, which is circuit simulation predicting information, for an RTL circuit without simulation for a netlist circuit with a relatively large number of elements. In result, it is possible to obtain information that can be obtained in the netlist circuit stage only by simulating RTL circuit.

Figure 10:
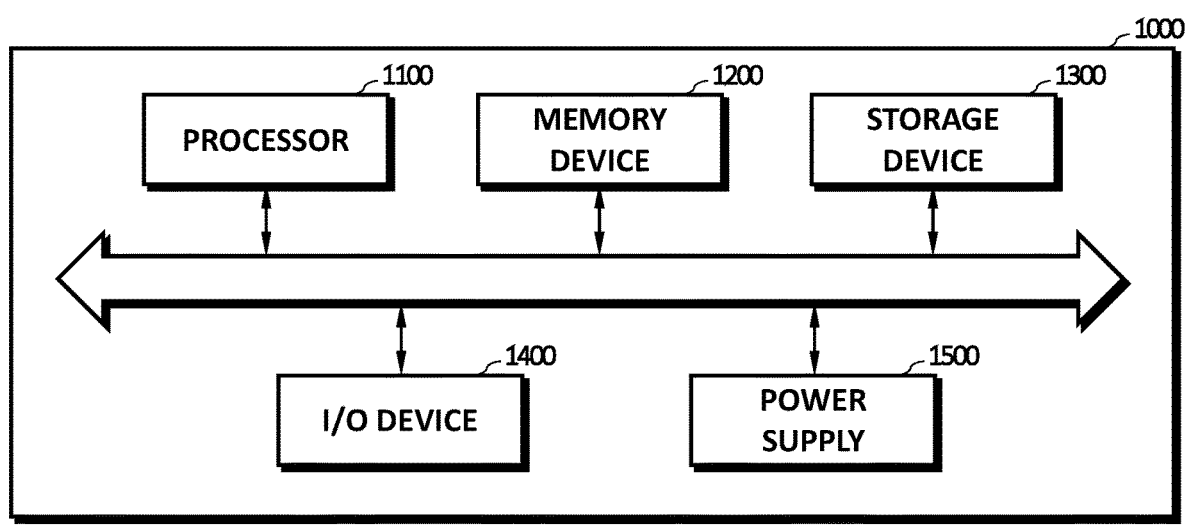
FIG. 10 is a block diagram illustrating a computing system including an integrated circuit design system according to an embodiment of the present disclosure.

FIG. 10 is a block diagram illustrating a computing system including an integrated circuit design system according to an embodiment of the present disclosure.

Referring to FIG. 10, the computing system 1000 may include a processor 1100, a memory device 1200, a storage device 1300, a power supply 1400, and an input/output device 1500. Meanwhile, although not shown in FIG. 10, the computing system 1000 may further include ports capable of communicating with a video card, a sound card, a memory card, a USB device, or the like, or communicating with other electronic devices.

As such, the processor 1100, the memory device 1200, the storage device 1300, the power supply 1400 and the input/output device 1500 included in the computing system 1000 are provided according to the technical idea of the present disclosure. It may include an integrated circuit designed by an integrated circuit design system or an integrated circuit design system according to embodiments. Specifically, in at least one of the processor 1100, the memory device 1200, the storage device 1300, the power supply 1400, and the input/output device 1500 or the semiconductor device may perform the simulation predicting information described above with reference to FIGS. 1 to 9B.

In another example, the processor 1100 controls the memory device 1200, the storage device 1300, the power supply 1400 and the input/output device 1500, thereby controlling the method for designing an integrated circuit as described in FIGS. 1 to 9B.

The processor 1100 may perform certain calculations or tasks. According to an embodiment, the processor 1100 may be a micro-processor (micro-processor) or a central processing unit (CPU). The processor 1100 may communicate with the memory device 1200, the storage device 1300 and the input/output device 1500 by using the bus 1600. According to an embodiment, the processor 1100 may also be connected to an expansion bus such as a Peripheral Component Interconnect (PCI) bus.

The memory device 1200 may store data necessary for the operation of the computing system 1000. For example, the memory device 1200 may be implemented as DRAM, mobile DRAM, SRAM, PRAM, FRAM, RRAM, and/or MRAM. there is. The storage device 1300 may include a solid-state drive, a hard disk drive, a CD-ROM, and the like. The memory device 1200 and the storage device 1300 may store the program related to the method for designing an integrated circuit described above with reference to FIGS. 1 to 9B.

The input/output device 1500 may include input means such as a keyboard, a keypad, and a mouse, and output means such as a printer and a display. The input/output device 1500 may receive a specification of a design circuit required for the method for designing an integrated circuit described above with reference to FIGS. 1 to 9B and display a design model generated by the method for designing an integrated circuit. The power supply 1400 may supply an operating voltage required for the operation of the computing system 1000.

The integrated circuit designed according to the above-described embodiments of the present disclosure may be implemented in various types of packages. For example, configurations of at least some of the integrated circuits include Package on Package (PoP), Ball grid arrays (BGAs), Chip scale packages (CSPs), Plastic Leaded Chip Carrier (PLCC), and Plastic Dual In-Line Package (PDIP)., Die in Waffle Pack, Die in Wafer Form, Chip On Board(COB), Ceramic Dual In-Line Package(CERDIP), Plastic Metric Quad Flat Pack(MQFP), Thin Quad Flatpack(TQFP), Small Outline(SOIC), Shrink Small Outline Package(SSOP), Thin Small Outline(TSOP), Thin Quad Flatpack(TQFP), System In Package(SIP), Multi Chip Package(MCP), Wafer-level Fabricated Package(WFP), Wafer-Level Processed Stack It may be mounted using packages such as Package (WSP).

Exemplary embodiments have been disclosed in the drawings and specification as described above. Although the embodiments have been described using specific terms in the present specification, these are used only for the purpose of explaining the technical idea of the present disclosure, and not used to limit the meaning or the scope of the present disclosure described in the claims. Therefore, it will be understood by those skilled in the art that various modifications and equivalent other embodiments are possible therefrom. Accordingly, the true technical protection scope of the present disclosure should be defined by the technical idea of the appended claims.

What is claimed is:

1. A method for designing integrated circuit based on a computer program including at least one instruction performed by an integrated circuit design system including a processor, the method comprising:
    mapping, by the processor, at least one netlist signal to at least one Register Transfer Level(RTL) signal;
    determining, by the processor, a target netlist signal among the at least one netlist signal;
    determining, by the processor, a target expression of the target netlist signal using the netlist signal mapped to the at least one RTL signal based on at least a part of the netlist circuit;
    simulating, by the processor, on the at least one RTL signal;
    calculating, by the processor, signal simulation predicting information for the target netlist signal using the target expression; and
    generating, by the processor, a design model by designing an integrated circuit using the signal simulation predicting information.

2. The method of claim 1, wherein the target netlist signal is the netlist signal not mapped to the at least one RTL signal.

3. The method of claim 1, wherein the mapping, by the processor, at least one netlist signal to at least one RTL signal comprising:
    determining, by the processor, a first RTL signal and a first netlist signal each corresponding to the same first node on the RTL circuit and the netlist circuit; and
    determining, by the processor, a second RTL signal and a second netlist signal each corresponding to the same second node on the RTL circuit and the netlist circuit.

4. The method of claim 3, wherein the determining, by the processor, a target expression of the target netlist signal using the netlist signal mapped to the at least one RTL signal based on at least a part of the netlist circuit comprising:
    determining, by the processor, a target node corresponding to the target netlist signal in the netlist circuit;
    tracing, by the processor, a first node and a second node from the target node in the netlist circuit; and
    generating, by the processor, the target expression of the target netlist signal by using the first netlist signal of the first node and the second netlist signal of the second node based on the result of the tracing.

5. The method of claim 4, wherein the target expression comprises at least one of an XOR operation, an AND operation, a NOT operation, and an OR operation for the first netlist signal and the second netlist signal.

6. The method of claim 3, wherein the simulating, by the processor, on the at least one RTL signal comprising:
    obtaining, by the processor, first simulation information for the first netlist signal; and
    obtaining, by the processor, second simulation information for the second netlist signal.

7. The method of claim 6, wherein the calculating, by the processor, the signal simulation predicting information for the target netlist signal using the target expression comprising:
   obtaining, by the processor, expression predicting information corresponding to the target expression from a predicting information database; and
   determining, by the processor, the signal simulation predicting information for the target netlist signal by using the expression predicting information, the first simulation information and the second simulation information.

8. The method of claim 1, the method further comprising:
   determining, by the processor, the target netlist signal and the additional netlist signal as key signals for obtaining circuit simulation predicting information for the netlist circuit; and
   obtaining, by the processor, the circuit simulation predicting information by applying the signal simulation predicting information and third simulation information corresponding to third netlist signal, to a predetermined predicting information expression.

9. A method for designing an integrated circuit based on a computer program including at least one instruction performed by an integrated circuit design system including a processor, for a first design circuit and a second design circuit in the circuit design sequence, the method comprising:
   determining, by the processor, a plurality of nodes of the second design circuit corresponding to a plurality of nodes of the first design circuit as a plurality of mapping nodes;
   determining, by the processor, a target node among the plurality of nodes of the second design circuit;
   determining, by the processor, a target expression of the target node using the plurality of mapping nodes based on at least a part of the second design circuit;
   simulating, by the processor, the first design circuit;
   calculating, by the processor, signal simulation predicting information for the target node using the target expression; and
   generating, by the processor, a design model by designing an integrated circuit using the signal simulation predicting information.

10. A programmed computing system for executing a computer program providing a method for designing an integrated circuit, the programmed computing system comprising:
   an input/output device configured to receive the specifications of a design circuit and displays a design model corresponding to the designed circuit;
   a memory device configured to store the computer program; and
   a processor configured to perform the method for designing the integrated circuit by accessing the memory device;
   wherein the processor, based on the computer program, configured to map at least one netlist signal to at least one RTL signal,
   determine a target netlist signal among the at least one netlist signal,
   determine a target expression of the target netlist signal using the netlist signal mapped to the at least one RTL signal based on at least a part of the netlist circuit,
   simulate on the at least one RTL signal,
   calculate signal simulation predicting information for the target netlist signal using the target expression and
   generate a design model by designing an integrated circuit using the signal simulation predicting information.

* * * * *